United States Patent
Tsurusawa et al.

(10) Patent No.: US 11,589,426 B2
(45) Date of Patent: Feb. 21, 2023

(54) HEATER MEMBER, HEATER TAPE, AND MOLDED BODY EQUIPPED WITH HEATER MEMBER

(71) Applicant: NITTO DENKO CORPORATION, Ibaraki (JP)

(72) Inventors: Toshihiro Tsurusawa, Osaka (JP); Hironobu Machinaga, Osaka (JP); Rie Hayashiuchi, Osaka (JP); Tetsuro Hori, Osaka (JP); Shu Sasaki, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 355 days.

(21) Appl. No.: 16/636,149

(22) PCT Filed: Aug. 3, 2018

(86) PCT No.: PCT/JP2018/029292
§ 371 (c)(1),
(2) Date: Feb. 3, 2020

(87) PCT Pub. No.: WO2019/027048
PCT Pub. Date: Feb. 7, 2019

(65) Prior Publication Data
US 2020/0163164 A1 May 21, 2020

(30) Foreign Application Priority Data

Aug. 4, 2017 (JP) .............................. JP2017-152002
Aug. 2, 2018 (JP) .............................. JP2018-145549

(51) Int. Cl.
*H05B 3/12* (2006.01)
*C23C 14/08* (2006.01)
(Continued)

(52) U.S. Cl.
CPC ............. *H05B 3/12* (2013.01); *C23C 14/086* (2013.01); *H05B 3/20* (2013.01); *H05B 3/86* (2013.01); *H05B 2203/017* (2013.01)

(58) Field of Classification Search
CPC ... H05B 3/12; H05B 3/20; H05B 3/86; H05B 3/06; H05B 3/141; H05B 3/84;
(Continued)

(56) References Cited

U.S. PATENT DOCUMENTS 5,911,899 A  6/1999 Yoshikai et al.
2015/0086789 A1  3/2015 Kajihara et al.
(Continued)

FOREIGN PATENT DOCUMENTS

CA  2379755 A1 * 1/2001
EP  0 487 338 A1  5/1992
(Continued)

OTHER PUBLICATIONS

Extended (Supplementary) European Search Report dated May 14, 2021, issued in counterpart EP application No. 18842042.6. (8 pages).
(Continued)

*Primary Examiner* — Shawntinat T Fuqua
(74) *Attorney, Agent, or Firm* — WHDA, LLP (57) ABSTRACT

A heater member (1*a*) includes a support (10), a heating element (20), and at least one pair of power supply electrodes (30). The support (10) is made of an organic polymer and has a sheet shape. The heating element (20) is made of a polycrystalline material containing indium oxide as a main component and in contact with one principal surface of the support (10). The power supply electrodes (30) are in contact with one principal surface of the heating element (20). The heating element (20) has a sheet resistance in the range from 10 to 150 Ω/sq. The heating element (20) has a (Continued)

thickness of more than 20 nm and not more than 200 nm. The internal stress of the heating element (20) as measured by an X-ray stress measurement method is 500 MPa or less.

9 Claims, 2 Drawing Sheets (51) Int. Cl.
*H05B 3/20* (2006.01)
*H05B 3/86* (2006.01)

(58) Field of Classification Search
CPC ............... H05B 3/03; H05B 2203/017; H05B 2203/013; H05B 2203/016; C23C 14/086; C23C 14/35; B32B 27/08
See application file for complete search history.

(56) References Cited

U.S. PATENT DOCUMENTS

| 2015/0102023 | A1* | 4/2015 | Mitsuhashi | ............... | H05B 3/84 |
| | | | | | 219/539 |
| 2016/0024640 | A1 | 1/2016 | Sasa et al. | | |
| 2020/0214089 | A1* | 7/2020 | Tsurusawa | ............... | H05B 3/03 |

FOREIGN PATENT DOCUMENTS

| EP | 0487338 | * | 5/1992 |
| EP | 0749266 | * | 12/1996 |
| JP | 61-175068 U | | 10/1986 |
| JP | 63-115048 U | | 7/1988 |
| JP | 09-125236 | * | 5/1991 |
| JP | H03-107123 A | | 5/1991 |
| JP | 6-283260 A | | 10/1994 |
| JP | 9-63754 A | | 3/1997 |
| JP | 9-125236 A | | 5/1997 |
| JP | 2002-134254 A | | 5/2002 |
| JP | 2004-12846 A | | 1/2004 |
| JP | 2007-220636 A | | 8/2007 |
| JP | 2016-46237 A | | 4/2016 |
| JP | 2017-91858 A | | 5/2017 |

OTHER PUBLICATIONS

International Search Report dated Oct. 16, 2018, issued in counterpart International Application No. PCT/JP2018/029292. (2 pages).
International Search Report dated Oct. 16, 2018, issued in International Application No. PCT/JP2018/029293 (Counterpart to U.S. Appl. No. 16/634,941)(1 page).
Extended (Supplementary) European Search Report dated Mar. 25, 2021, issued in EP Application No. 18841328.0. (Counterpart to U.S. Appl. No. 16/634,941) (9 pages).
Non-Final Office Action dated Jul. 28, 2022, issued in U.S. Appl. No. 16/634,941 (29 pages).

* cited by examiner

HEATER MEMBER, HEATER TAPE, AND MOLDED BODY EQUIPPED WITH HEATER MEMBER

TECHNICAL FIELD

The present invention relates to a heater member, a heater tape, and a molded body equipped with a heater member (also referred to as "heater member equipped molded body" hereinafter).

BACKGROUND ART

Conventionally, transparent planar heaters are known that are configured to remove mist and frost adhering to surfaces of transparent bodies by heating the surfaces.

For example, Patent Literature 1 discloses a transparent body with a heater. In this transparent body with the heater, a transparent conductive thin film is formed on a surface of a transparent substrate. For example, the transparent conductive thin film made of tin oxide, indium oxide, or the like is formed on the entire surface of the substrate made of glass, an acrylic resin, a polyethylene resin, or the like by a method such as vacuum deposition or sputtering. Patent Literature 1 suggests that power supply electrodes exhibit low adhesion to the transparent conductive thin film. On this account, a layer made of titanium or a titanium alloy is formed on the transparent conductive thin film, and at least one pair of power supply electrodes are provided on the layer made of titanium or a titanium alloy. According to Patent Literature 1, providing the layer made of titanium or a titanium alloy between the transparent conductive thin film and the power supply electrodes improves the adhesion of the power supply electrodes. This prevents separation of the power supply electrodes.

CITATION LIST

Patent Literature

Patent Literature 1: JP 2002-134254 A

SUMMARY OF INVENTION

Technical Problem

According to Patent Literature 1, the transparent body equipped with the heater is adapted such that the layer made of titanium or a titanium alloy is provided between the transparent conductive thin film and the power supply electrodes to prevent the separation of the power supply electrodes. In Patent Literature 1, the relationship between the temperature rise rate of the heater and the durability of the transparent conductive thin film was not specifically examined.

In light of the foregoing, it is an object of the present invention to provide a heater member having durability advantageous for constructing a heater operable at a high temperature rise rate. The present invention also provides a heater tape and a heater member-equipped molded body each including such a heater member.

Solution to Problem

The present invention provides a heater member including: a support that is made of an organic polymer and has a sheet shape; a heating element that is a transparent conductive film made of a polycrystalline material containing indium oxide as a main component, the heating element being in contact with one principal surface of the support; and at least one pair of power supply electrodes in contact with one principal surface of the heating element, wherein the heating element has a sheet resistance in a range from 10 to 150 Ω/sq, the heating element has a thickness of more than 20 nm and not more than 200 nm, and an internal stress of the heating element as measured by an X-ray stress measurement method is 500 MPa or less.

The present invention also provides a heater tape including: the heater member described above; a separator that is disposed closer to a fourth principal surface than to a third principal surface, the third principal surface being the principal surface of the support with which the heating element is in contact and the fourth principal surface being a principal surface of the support located on a side opposite to the third principal surface; and a second pressure-sensitive adhesive layer that is disposed between the separator and the support in such a manner that the second pressure-sensitive adhesive layer is in contact with the separator and the support.

The present invention also provides a heater member-equipped molded body including: the heater member described above; a molded body that is disposed closer to a fourth principal surface than to a third principal surface, the third principal surface being the principal surface of the support with which the heating element is in contact and the fourth principal surface being a principal surface of the support located on a side opposite to the third principal surface; and a second pressure-sensitive adhesive layer that is disposed between the molded body and the support in such a manner that the second pressure-sensitive adhesive layer is in contact with the molded body and the support.

Advantageous Effects of Invention

The heater member described above has durability advantageous for constructing a heater operable at a high temperature rise rate.

DESCRIPTION OF EMBODIMENTS

The inventors of the present invention obtained the following new findings in the course of studying how to maintain the transparency of transparent bodies of heaters, and developed the heater member according to the present invention on the basis of these new findings.

In a heater, in order to quickly remove substances that impair the transparency of a transparent body, such as mist, frost, and snow adhering to the transparent body, it is desirable that a heating element, which is a transparent conductive film, heat up to a desired temperature within a short period of time. In other words, it is desirable that the heater be operable at a high temperature rise rate (e.g., 20° C./min or more). To this end, it is desirable that the transparent conductive film have a low sheet resistance. The sheet resistance of the transparent conductive film becomes lower as the transparent conductive film becomes thicker. Accordingly it is desirable that the transparent conductive film have a thickness equal to or greater than a predetermined value. According to the analysis performed by the inventors, it is desirable that the heating element, which is the transparent conductive film, have a thickness of more than 20 nm in order to set the sheet resistance of the transparent conductive film low enough to allow the heater to operate at a high temperature rise rate. Also, the inventors newly found that the transparent conductive film may crack when the heater is operated at a high temperature rise rate. In light of the foregoing, the inventors conducted in-depth studies to establish a technique for preventing cracking of the transparent conductive film when the heater is operated at a high temperature rise rate. As a result, the inventors of the present invention newly discovered that, by adjusting the internal stress (compressive stress) of the transparent conductive film to fall within a specific range, the transparent conductive film can have favorable durability, whereby the occurrence of cracking can be prevented even when the heater is operated at a high temperature rise rate.

Hereinafter, embodiments of the present invention will be described with reference to the drawings. The following embodiments describe illustrative implementation of the present invention, and the present invention is not limited to the following embodiments.

Figure 1A:
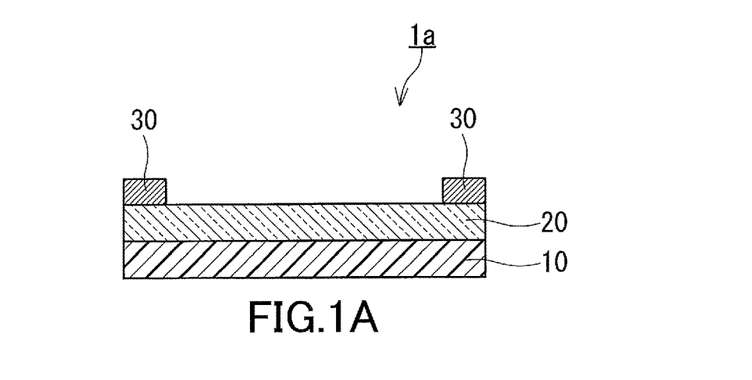
FIG. 1A is a cross-sectional view showing an example of the heater member of the present invention.

As shown in FIG. 1A, a heater member 1a includes a support 10, a heating element 20, and at least one pair of power supply electrodes 30. The support 10 is made of an organic polymer and has a sheet shape. The heating element 20 is a transparent conductive film made of a polycrystalline material containing indium oxide as a main component, and is in contact with one principal surface of the support 10. The at least one pair of power supply electrodes 30 are in contact with one principal surface of the heating element 20. The heating element 20 has a sheet resistance in the range from 10 to 150 Ω/sq. The heating element 20 has a thickness of more than 20 nm and not more than 200 nm. The internal stress of the heating element 20 as measured by an X-ray stress measurement method is 500 MPa or less. The internal stress that resides in the heating element 20 is typically a compressive stress. The internal stress of the heating element 20 can be measured in a manner described in examples of the present invention according to the X-ray stress measurement method.

When the heating element 20 included in the heater member 1a has a thickness of more than 20 nm, the sheet resistance of the heating element 20 can be easily adjusted to 150 Ω/sq or less. When the heating element 20 has a sheet resistance of 150 Ω/sq or less, the heating element 20 can heat up to a desired temperature within a short period of time. That is, a heater provided with the heater member 1a is operable at a high temperature rise rate. Also, when the heating element 20 has a thickness of 200 nm or less, the heater member 1a can be produced efficiently, which allows the heater member 1a to be produced at low cost. In addition, when the heating element 20 has a thickness of 200 nm or less, the heating element 20 is less likely to crack. From the viewpoint of adjusting the thickness of the heating element 20 to 200 nm or less, the sheet resistance of the heating element 20 is set to 10 Ω/sq or more.

When the heating element 20 has an internal stress of 500 MPa or less with the thickness of the heating element 20 falling within the above-described range, cracking of the transparent conductive film can be advantageously prevented even when the heater is operated at a high temperature rise rate. Accordingly, the heater member 1a has favorable durability.

The thickness of the heating element 20 is desirably 25 nm or more, and more desirably 27 nm or more. The thickness of the heating element 20 is desirably 180 nm or less, and more desirably 170 nm or less.

The sheet resistance of the heating element 20 is desirably 10 to 80 Ω/sq, and more desirably 10 to 60 Ω/sq.

The internal stress of the heating element 20 is desirably 490 MPa or less, and more desirably 480 MPa or less.

The true stress and the thermal stress are relevant to the internal stress of the heating element 20. The true stress is the stress caused by defects that have been generated inside the transparent conductive film during the formation of the transparent conductive film. The thermal stress is the stress caused by the temperature conditions for forming the transparent conductive film and by the difference in coefficient of linear expansion between the support 10 and the film formed on the support 10. The true stress can be reduced by adjusting the conditions for forming the transparent conductive film (e.g., conditions for sputtering) so as to reduce the generation of defects inside the transparent conductive film. The thermal stress can be reduced by adjusting the temperature conditions for forming the transparent conductive film and the dimensional stability of the support 10. Accordingly, by appropriately selecting the conditions for forming the transparent conductive film and the material of the support 10, the internal stress of the heating element 20 as measured by the X-ray stress measurement method can be set to 500 MPa or less.

The support 10 has properties to be described below, for example. A 4 mm wide test piece of the support 10 is heated from 25° C. to 150° C. under application of a tensile force of 0.02 N in a specific direction orthogonal to the width direction of the test piece. At this time, the dimensional change rate of the test piece in the specific direction is −0.2% to 1%. When the dimensional change rate is a negative value, it means the shrinkage of the test piece. When the transparent conductive film is to be formed on the support 10, the support 10 needs to be heated to a predetermined temperature for annealing or the like, for example. In this case, if the dimensional change resulting from the heating and cooling of the support 10 were large, the internal stress of the transparent conductive film would be high, and the transparent conductive film would be more likely to crack during the operation of the heater at a high temperature rise rate. However, since the support 10 has favorable dimensional stability in the temperature range from 25° C. to 150° C. as described above, the internal stress of the heating element 20 can be easily adjusted to 500 MPa or less.

The dimensional stability of the heater member 1a is determined mostly by the dimensional stability of the support 10. For example, a 4 mm wide test piece of the heater member 1a unprovided with the pair of electrodes 30 is prepared. When this test piece is heated from 25° C. to 150° C. under application of a tensile force of 0.02 N in a specific direction orthogonal to the width direction of the test piece, the dimensional change rate of this test piece in the specific direction is, for example, −0.2% to 1%. For example, if the support 10 has the dimensional stability defined above in the temperature range from 25° C. to 150° C., the heater member 1a also has such dimensional stability in the temperature range from 25° C. to 150° C.

Typically, light having a wavelength in a predetermined range can be transmitted through the heater member 1a. For example, light having a wavelength in a predetermined range within the visible light region and light having a wavelength in a predetermined range in the near-infrared region can be transmitted through the heater member 1a.

The material of the support 10 is not limited to a specific material as long as the internal stress of the heating element 20 can be adjusted to 500 MPa or less. It is desirable that the support 10 be made of at least one selected from the group consisting of polyethylene naphthalates, polyimides, polycarbonates, polyether ether ketones, and aromatic polyamides. With this configuration, the support 10 has favorable dimensional stability in the temperature range from 25° C. to 150° C., and the heater member 1a has desired transparency.

The support 10 may include a functional layer such as a hard coat layer, a stress buffer layer, or an optical adjustment layer. Each of these functional layers constitutes, for example, one principal surface of the support 10 in contact with the heating element 20. Each of these functional layers can serve as a base of the heating element 20.

The thickness of the support 10 is not limited to a particular thickness.

From the viewpoint of favorable transparency, favorable strength, and ease of handling, the thickness of the support 10 is 10 μm to 200 μm, for example. The thickness of the support 10 is desirably 20 μm to 180 μm, and more desirably 30 μm to 160 μm.

The heating element 20 has a specific resistance of $1.5 \times 10^{-4}$ to $5.0 \times 10^{-4}$ Ω·cm, for example. With this configuration, when the thickness of the heating element 20 is adjusted to more than 20 nm and not more than 200 nm, a desired sheet resistance of the heating element 20 is achieved easily. The heating element 20 desirably has a specific resistance of more than $1.5 \times 10^{-4}$ Ω·cm and not more than $3.0 \times 10^{-4}$ Ω·cm, and more desirably $1.6 \times 10^{-4}$ Ω·cm to $2.8 \times 10^{-4}$ Ω·cm.

The transparent conductive film used as the heating element 20 is not particularly limited. Desirably, the transparent conductive film is made of indium tin oxide (ITO).

The power supply electrodes 30 have a thickness of 1 μm or more, for example. In this case, the current-carrying capacity of the power supply electrodes 30 is easily adjusted to a value suitable for operating the heater at a high temperature rise rate. Accordingly, when the heater is operated at a high temperature rise rate, separation of the power supply electrodes 30 is less likely to occur. The power supply electrodes 30 are much thicker than electrodes formed on a transparent conductive film used in display devices such as a touch panel. The power supply electrodes 30 desirably have a thickness of 1.5 μm or more, and more desirably 2 μm or more. The power supply electrodes 30 may have, for example, a thickness of 5 mm or less, 1 mm or less, or 700 μm or less.

In the heater member 1a, when a DC voltage of 12 V is applied to the pair of power supply electrodes 30, the temperature rise rate of the heating element 20 is, for example, 20° C./min or more. As described above, the heating element 20 can heat up to a desired temperature within a short period of time. The temperature rise rate of the heating element 20 when a DC voltage of 12 V is applied to the pair of power supply electrodes 30 may be 15° C./min or more, desirably 25° C./min or more, and more desirably 30° C./min or more.

The transparent conductive film is formed by, for example, performing sputtering using a target material containing indium oxide as a main component to form a thin film derived from the target material on one principal surface of the support 10. The thin film derived from the target material is desirably formed on one principal surface of the support 10 by high magnetic field DC magnetron sputtering. By forming the transparent conductive film in the above-described manner, defects are less likely to be generated in the transparent conductive film, and the internal stress of the heating element 20 is easily adjusted to 500 MPa or less.

The thin film formed on one principal surface of the support 10 is subjected to annealing, when necessary. For example, the thin film is annealed by being placed in the air at 120° C. to 150° C. for 1 to 3 hours. This facilitates crystallization of the thin film, whereby the transparent conductive film made of a polycrystalline material is formed advantageously. When the temperature of the environment in which the annealing of the thin film is performed and the time period for performing the annealing are within the above-described ranges, defects are less likely to be generated in the transparent conductive film, and the internal stress of the heating element 20 is easily adjusted to 500 MPa or less.

The pair of power supply electrodes 30 are not particularly limited as long as they can supply power from a power source (not shown) to the heating element 20. For example, the pair of power supply electrodes 30 are made of a metal material. A masking film is placed so as to partially cover the principal surface of the heating element 20 located on the side opposite to the principal surface of the heating element 20 in contact with the support 10. When another film is laminated on the principal surface of the heating element 20, the masking film may be placed on this film. In this state, a metal film with a thickness of 1 μm or more is formed on exposed portions of the heating element 20 and the masking film by a dry process such as chemical vapor deposition (CVD) or physical vapor deposition (PVD) or by a wet process such as plating. Thereafter, by removing the masking film, portions of the metal film remain in the exposed portions of the heating element 20, whereby the pair of power supply electrodes 30 can be formed. Alternatively, the pair of power supply electrodes 30 may be formed by forming a metal film with a thickness of 1 μm or more on the principal surface of the heating element 20 by a dry process such as CVD or PVD or by a wet process such as plating and then removing unnecessary portions of the metal film by etching.

The pair of power supply electrodes 30 may be formed using a conductive paste. In this case, the pair of power supply electrodes 30 can be formed by applying a conductive paste to the heating element 20, which is a transparent conductive film, according to a method such as screen printing.

(Modifications)

The heater member 1a can be modified in various respects. For example, the heater member 1a may be modified so as to have the configuration of a heater member 1b shown in FIG. 1B. Unless otherwise stated, the configuration of the heater member 1b is the same as the configuration of the heater member 1a. Components of the heater member 1b that are the same as or correspond to those of the heater member 1a are given the same reference numerals, and detailed descriptions thereof are omitted. The descriptions regarding the heater member 1a also apply to the heater member 1b, unless technically incompatible.

Figure 1B:
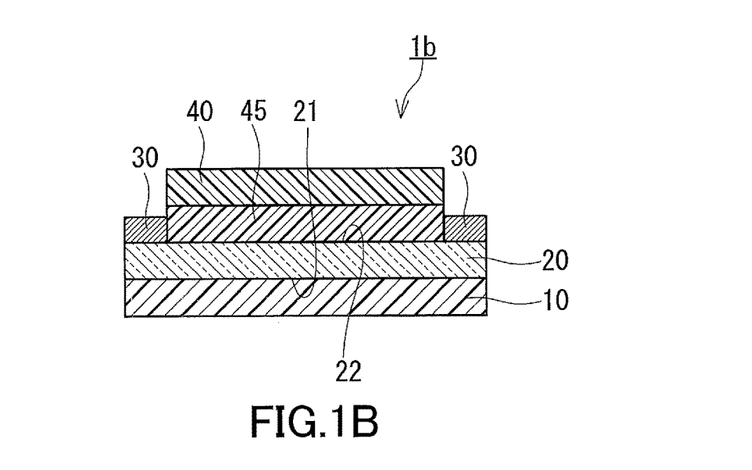
FIG. 1B is a cross-sectional view showing another example of the heater member of the present invention.

As shown in FIG. 1B, the heater member 1b further includes a protective film 40 and a first pressure-sensitive adhesive layer 45. The protective film 40 is disposed closer to a second principal surface 22 than to a first principal surface 21. The first principal surface 21 is a principal surface of a heating element 20 in contact with a support 10. The second principal surface 22 is a principal surface of the heating element 20 located on the side opposite to the first principal surface 21. The first pressure-sensitive adhesive layer 45 is located between the protective film 40 and the heating element 20 in such a manner that it is in contact with the protective film 40 and the heating element 20. As described above, the protective film 40 is bonded to the second principal surface 22 of the heating element 20 by the first pressure-sensitive adhesive film 45. Since the heating element 20 is made of a polycrystalline material containing indium oxide as a main component as described above, the toughness thereof is generally low. On this account, by protecting the heating element 20 with the protective film 40, the impact resistance of the heater member 1b, can be improved.

The protective film 40 is not particularly limited as long as it has suitable transparency. It is desirable that the protective film 40 exhibit favorable dimensional stability in use of the heater member 1b, for example. From this perspective, it is desirable that the protective film 40 have properties to be described below. When a 4 mm wide test piece of the protective film 40 is heated from 25° C. to 150° C. under application of a tensile force of 0.02 N in a specific direction orthogonal to the width direction of the test piece, the dimensional change rate of this test piece in the specific direction is −0.2% to 1%. With this configuration, separation of the protective film 40 resulting from the dimensional change of the protective film 40 in use of the heater member 1b is less likely to occur.

The protective film 40 is made of at least one selected from the group consisting of polyethylene naphthalates, polyimides, polycarbonates, polyether ether ketones, and aromatic polyamides, for example. With this configuration, the support 10 has favorable dimensional stability in the temperature range from 25° C. to 150° C., and the heater member 1b has desired transparency. The thickness of the protective film 40 is not particularly limited, and is, for example, 20 μm to 200 μm, desirably 25 μm to 190 μm, and more desirably 30 μm to 180 μm. With this configuration, the heater member 1b can be prevented from having an excessively large thickness while maintaining favorable impact resistance.

The first pressure-sensitive adhesive layer 45 is formed of a known optical pressure-sensitive adhesive such as an acrylic pressure-sensitive adhesive, for example.

(Heater Tape)

Figure 2:
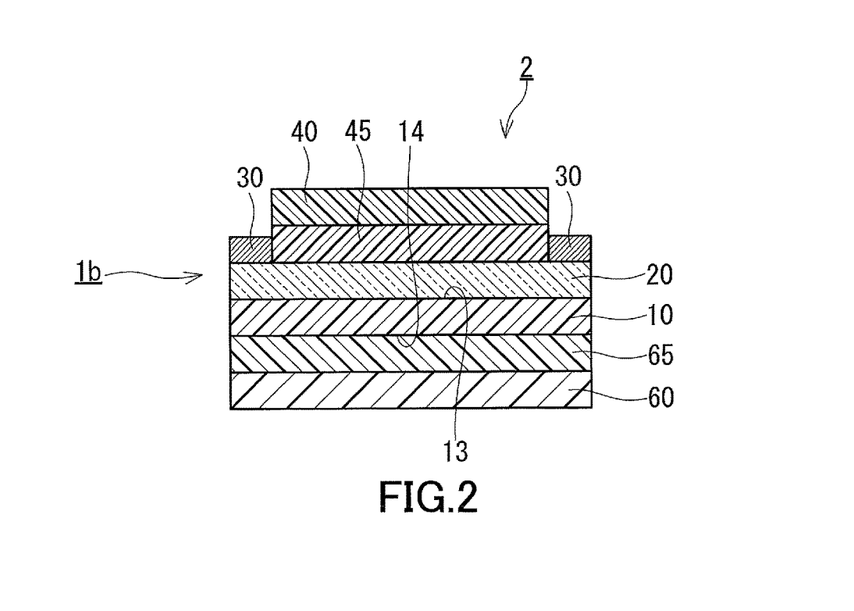
FIG. 2 is a cross-sectional view showing an example of the heater tape of the present invention.

A heater tape can be produced using the heater member 1a or the heater member 1b. As shown in FIG. 2, a heater tape 2 includes the heater member 1b, a separator 60, and a second pressure-sensitive adhesive layer 65. The separator 60 is disposed closer to a fourth principal surface 14 than to a third principal surface 13. The third principal surface 13 is a principal surface of the support 10 with which the heating element 20 is in contact. The fourth principal surface 14 is a principal surface of the support 10 located on the side opposite to the third principal surface 13. The second pressure-sensitive adhesive layer 65 is located between the separator 60 and the support 10 in such a manner that it is in contact with the separator 60 and the support 10. By peeling off the separator 60, the second pressure-sensitive adhesive layer 65 is exposed. Thereafter, by pressing the second pressure-sensitive adhesive layer 65 against an object to which the heater member 1b is to be bonded, the heater member 1b can be bonded to the object. The heater tape 2 may be modified so as to include the heater member 1a instead of the heater member 1b.

The separator 60 is typically a film that keeps the pressure-sensitive adhesive force of the second pressure-sensitive adhesive layer 65 when it covers the second pressure-sensitive adhesive layer 65 and can be easily peeled off from the second pressure-sensitive adhesive layer 65. The separator 60 is, for example, a film made of a polyester resin such as polyethylene terephthalate (PET).

The second pressure-sensitive adhesive layer 65 is formed of a known optical pressure-sensitive adhesive such as an acrylic pressure-sensitive adhesive, for example.

(Heater Member-Equipped Molded Body)

Figure 3:
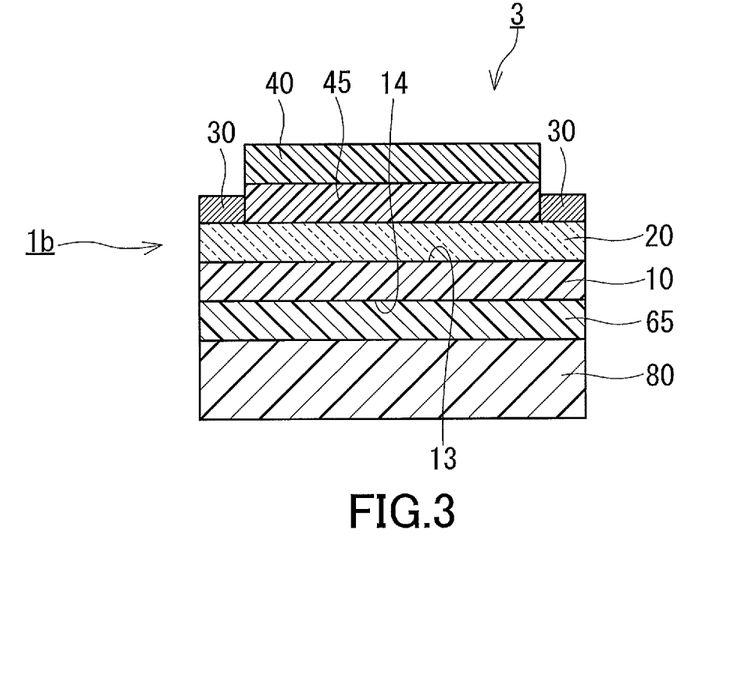
FIG. 3 is a cross-sectional view showing an example of the heater member-equipped molded body of the present invention.

A heater member-equipped molded body 3 can be produced using the heater member 1a or the heater member 1b. As shown in FIG. 3, a heater member equipped molded body 3 includes the heater member 1b, a molded body 80, and a second pressure-sensitive adhesive layer 65. The molded body 80 is disposed closer to a fourth principal surface 14 than to a third principal surface 13. The third principal surface 13 is a principal surface of the support 10 with which the heating element 20 is in contact. The fourth principal surface 14 is a principal surface of the support 10 located on the side opposite to the third principal surface 13. The second pressure-sensitive adhesive layer 65 is located between the molded body 80 and the support 10 in such a manner that it is in contact with the molded body 80 and the support 10. The heater member-equipped molded body 3 may be modified so as to include the heater member 1a instead of the heater member 1b.

The molded body 80 is typically a component that transmits light having a wavelength in a specific range. For example, when substances such as mist, frost, and snow are adhering to the surface of the molded body 80, light that should be transmitted through the molded body 80 is blocked. However, by applying a voltage to the pair of power supply electrodes 30 of the heater member 1b to cause the heating element 20 to generate heat, the substances such as mist, frost, and snow on the surface of the molded body 80 can be removed. This allows the heater member equipped molded body 3 to maintain its transparency. The light that should be transmitted through the molded body 80 is not limited to visible light, and may be ultraviolet light or near infrared light.

The second pressure-sensitive adhesive layer 65 is formed of a known optical pressure-sensitive adhesive such as an acrylic pressure-sensitive adhesive, for example.

The heater member-equipped molded body 3 can be produced by, for example, pressing the second pressure-sensitive adhesive layer 65 exposed after peeling off the separator 60 of the heater tape 2 against the molded body 80 to bond the heater member 1b to the molded body 80.

EXAMPLES

Hereinafter, the present invention will be described in more detail with reference to examples. The present invention is not limited to the following examples. First, evaluation methods and measurement methods used in the examples and comparative examples will be described.

[Thickness Measurement]

The thickness of a transparent conductive film (heating element) of a heater member according to each of the examples and comparative examples was measured by X-ray reflectometry using an X-ray diffractometer (Rigaku Corporation, product name: RINT 2200). The results are shown in Table 1. Also, the X-ray diffraction pattern of the transparent conductive film was obtained using the X-ray diffractometer. The X-rays used in the measurement were Cu-Kα X-rays. From the X-ray diffraction patterns obtained, it was confirmed that the transparent conductive films in all the examples and comparative examples had a polycrystalline structure. Also, the thickness of each power supply electrode formed on the transparent conductive film of the heater member according to each of the examples and comparative examples was measured by measuring the height of an end portion of the power supply electrode of the heater member according to each of the examples and comparative examples using a stylus surface profiler (ULVAC, Inc., product name: Dektak 8). The results are shown in Table 1.

[Sheet Resistance and Specific Resistance]

The sheet resistance of the transparent conductive film (heating element) of the heater member according to each of the examples and comparative examples was measured in accordance with the Japanese Industrial Standard (JIS) Z 2316-1: 2014 by an eddy current method using a non-contact type resistance measurement instrument (Napson Corporation, product name: NC-80MAP). The results are shown in Table 1. In addition, the specific resistance of the transparent conductive film (heating element) of the heater member according to each of the examples and comparative examples was determined by calculating the product of the thickness of the transparent conductive film (heating element) obtained by the thickness measurement and the sheet resistance of the transparent conductive film (heating element). The results are shown in Table 1.

[Internal Stress]

Using the X-ray diffractometer (Rigaku Corporation, product name: RINT 2200), a sample was irradiated with Cu-Kα X-rays (wavelength λ: 0.1541 nm) that had been emitted from a light source of 40 kV and 40 mA and had been transmitted through a parallel beam optical system. Then, the internal stress (compressive stress) of the transparent conductive film was evaluated using the principle of the $\sin^2\psi$ method. The $\sin^2\psi$ method is a method for determining the internal stress of polycrystalline thin films from the dependence of crystal lattice strain on angles ($\psi$). Using the above-described X-ray diffractometer, diffraction intensities were measured at intervals of 0.02° in the range from 2θ=29.8° to 31.2° by θ/2θ scan measurement. The integration time at each measurement point was set to 100 seconds. The peak angle 2θ of the obtained X-ray diffraction (the peak of the (222) plane of ITO) and the wavelength λ of the X-rays emitted from the light source were used to calculate the ITO crystal lattice spacing d at each measurement angle ($\psi$). Then, the crystal lattice strain E was calculated from the crystal lattice spacing d using the relationships of the following equations (1) and (2). λ is the wavelength of the X-rays (Cu-Kα X-rays) emitted from the light source, and λ=0.1541 nm. $d_0$ is a lattice spacing of ITO in an unstressed state, and $d_0$=0.2910 nm. The value of $d_0$ is the value obtained from the database of the International Center for Diffraction Data (ICDD).

$$2d \sin \theta = \lambda \quad (1)$$

$$\varepsilon = (d-d_0)/d_0 \quad (2)$$

Figure 4:
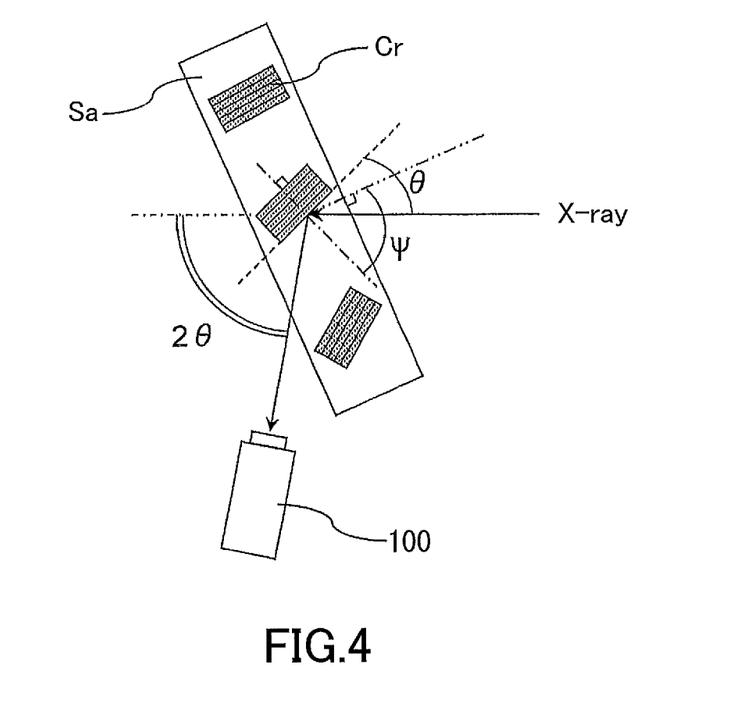
FIG. 4 is a diagram conceptually illustrating a method for measuring the internal stress of a transparent conductive film.

As shown in FIG. 4, the X-ray diffraction measurement was carried out for each of the cases where the angle ($\psi$) formed between the normal to a principal surface of a sample Sa of the transparent conductive film and the normal to a crystal plane of the ITO crystal Cr was 45°, 52°, 60°, 70°, and 90°, and the crystal lattice strain e at each angle ($\psi$) was calculated. Thereafter, the residual stress (internal stress) σ of the transparent conductive film in the in-plane direction was determined as per the following formula (3) using the slope of the straight line obtained by plotting the relationship between $\sin^2\psi$ and the crystal lattice strain ε. The results are shown in Table 1.

$$\varepsilon = ((1+\nu)/E)\sigma \sin^2\psi - (2\nu/E)\sigma \quad (3)$$

In the above formula (3), E is the Young's modulus (116 GPa) of ITO, and ν is the Poisson's ratio (0.35). These values are described in D. G. Neerinck and T. J. Vink, "Depth Profiling of thin ITO films by grazing incidence X-ray diffraction", Thin Solid Films, 278 (1996), pp. 12-17. In FIG. 4, a detector 100 detects X-ray diffraction.

[Evaluation of Dimensional Change of Support]

Using a thermomechanical analyzer (Hitachi High-Tech Science Corporation, product name: TMA/SS6100), the temperature of a test piece of a support of the heater member according to each of the examples and comparative examples was raised from 25° C. to 150° C., and the dimensional change rate of the test piece was measured. The test piece had a width of 4 mm. The distance between a pair of chucks used to fix the test piece before raising the temperature of the test piece was 10 mm. A tensile force of 0.02 N was continuously applied to the test piece in the direction orthogonal to the width direction of the test piece. In this measurement, the temperature rise rate of the test piece was set to +5° C./min. The dimensional change rate was calculated as per the following equation (4). The results are shown in Table 1. $D_{150}$ is the distance between the chucks when the temperature of the test piece had reached 150° C. $D_i$ is the distance between the chucks at the start of the temperature rise, and $D_i$=10 mm.

$$\text{Dimensional change rate}[\%] = \{(D_{150}-D_i/D_i\} \times 100 \quad (4)$$

[Temperature Rise Rate when Electrically Energized]

Using a constant voltage DC power supply manufactured by Kikusui Electronics Corp., an energization test was performed by applying a voltage of 12 V to the pair of power supply electrodes of the heater member according to each of the examples and comparative examples to cause a current to flow through the transparent conductive film (heating element) of the heater member. During the energization test, the surface temperature of the transparent conductive film (heating element) or a protective film was measured using a thermograph manufactured by FLIR Systems, Inc., and the temperature rise rate was calculated. The results are shown in Table 1.

[Examination of Cracking in Transparent Conductive Film]

Whether the transparent conductive film had cracked during the energization test was examined by visual observation. The results are shown in Table 1. In Table 1, "N" indicates that the transparent conductive film had not cracked, and "Y" indicates that the transparent conductive film had cracked.

Whether separation between the power supply electrodes and the transparent conductive film had occurred during the conductivity test was examined by visual observation. The results are shown in Table 1. In Table 1, "N" indicates that separation between the power supply electrodes and the transparent conductive film had not occurred, and "Y" indicates that separation between the power supply electrodes and the transparent conductive film had occurred.

Example 1

An ITO film was formed on one principal surface of a 125 µm thick polyethylene naphthalate (PEN) film (Tijin Film Solutions Limited, product name: TEONEX) by DC magnetron sputtering using indium tin oxide (ITO) (tin oxide content: 10 wt %) as a target material in a high magnetic field with the magnetic flux density of the horizontal magnetic field on the surface of the target material being 100 mT (millitesla) and in the presence of an inert gas. The PEN film with the ITO film formed thereon was annealed by being placed in the air at 150° C. for 3 hours. As a result, ITO was crystallized, whereby a transparent conductive film was formed. The thickness of the transparent conductive film was 115 nm. The transparent conductive film obtained as a result of the annealing had a polycrystalline structure.

Next, the PEN film with the transparent conductive film formed thereon was cut into a strip shape (short side: 30 mm×long side: 50 mm). Then, the transparent conductive film was partially covered with a masking film such that a pair of end portions of the transparent conductive film facing each other and extending in the longitudinal direction were exposed. The pair of end portions each had a width of 2 mm. In this state, a Cu thin film with a thickness of 100 nm was formed on the transparent conductive film and the masking film by DC magnetron sputtering. Further, the Cu thin film was subjected to wet plating to increase the thickness of the Cu film to 3 µm. Thereafter, the masking film was removed, whereby a pair of power supply electrodes were formed at portions corresponding to the pair of end portions of the transparent conductive film. In the above-described manner, a heater member according to Example 1 was produced.

Example 2

A heater member according to Example 2 was produced in the same manner as in Example 1, except that a 50 µm thick transparent polyimide film (transparent PI, KOLON Industries, Inc.) was used instead of the PEN film.

Example 3

A heater member according to Example 3 was produced in the same manner as in Example 1, except that a 75 µm thick polyimide film (PI, Du Pont-Toray Co Ltd., product name: Kapton) was used instead of the PEN film.

Example 4

A heater member according to Example 4 was produced in the same manner as in Example 1, except that a 125 µm thick polycarbonate (PC) film (Sumitomo Chemical Co., Ltd., product name: TECHNOLLOY C0000) was used instead of the PEN film.

Example 5

A heater member according to Example 5 was produced in the same manner as in Example 1, except that the conditions for the DC magnetron sputtering for forming an ITO film were changed such that a transparent conductive film had a thickness of 29 nm.

Example 6

A heater member according to Example 6 was produced in the same manner as in Example 1, except that the conditions for the DC magnetron sputtering for forming an ITO film were changed such that a transparent conductive film had a thickness of 153 nm.

Example 7

An ITO film was formed on one principal surface of a 125 µm thick polyethylene naphthalate (PEN) film (TEIJIN LIMITED, product name: TEONEX) by DC magnetron sputtering using indium tin oxide (ITO) (tin oxide content: 10 wt %) as a target material in a high magnetic field with the magnetic flux density of the horizontal magnetic field on the surface of the target material being 100 mT (millitesla) and in the presence of an inert gas. The PEN film with the ITO film formed thereon was annealed by being placed in the air at 150° C. for 3 hours. As a result, ITO was crystallized, whereby a transparent conductive film was formed. The thickness of the transparent conductive film was 115 nm. The transparent conductive film obtained as a result of the annealing had a polycrystalline structure.

Next, the PEN film with the transparent conductive film formed thereon was cut into a strip shape (short side: 30 mm×long side: 50 mm). Then, the transparent conductive film was partially covered with a masking film such that a pair of end portions of the transparent conductive film facing each other and extending in the longitudinal direction were exposed. The pair of end portions each had a width of 2 mm. In this state, a silver-containing paste was screen-printed on the transparent conductive film and the masking film. After the printed layer of the silver-containing paste had hardened sufficiently, the masking film was removed, whereby a pair of power supply electrodes were formed at portions corresponding to a pair of end portions of the transparent conductive film. The thickness of the power supply electrodes was 3 µm. In the above-described manner, the heater member according to Example 7 was produced.

Example 8

A heater member according to Example 8 was produced in the same manner as in Example 1, except that the conditions for the DC magnetron sputtering for forming an ITO film were changed such that a transparent conductive film had a thickness of 50 nm.

Example 9

A heater member according to Example 9 was produced in the same manner as in Example 8, except that the temperature when annealing the ITO film was changed to 180° C.

Example 10

A heater member according to Example 10 was produced in the same manner as in Example 8, except that the conditions for the wet plating of a Cu thin film were changed such that power supply electrodes had a thickness of 20 µm.

Example 11

A planar heater member according to Example 11 was produced in the same manner as in Example 1, except that the conditions for the DC magnetron sputtering for forming an ITO film were changed such that a transparent conductive film had a thickness of 21 nm.

Example 12

A planar heater member according to Example 12 was produced in the same manner as in Example 1, except that the conditions for the DC magnetron sputtering for forming an ITO film were changed such that a transparent conductive film had a thickness of 168 nm.

Example 13

An ITO film with a thickness of 115 nm was formed on one principal surface of a 125 μm thick polyethylene naphthalate (PEN) film (TEIJIN LIMITED, product name: TEONEX) by DC magnetron sputtering using indium tin oxide (ITO) (tin oxide content: 10 wt %) as a target material in a high magnetic field with the magnetic flux density of the horizontal magnetic field on the surface of the target material being 100 mT (millitesla) and in the presence of an inert gas. The PEN film with the ITO film formed thereon was annealed by being placed in the air at 150° C. for 3 hours. As a result, ITO was crystallized, whereby a transparent conductive film was formed. The transparent conductive film obtained as a result of the annealing had a polycrystalline structure.

Next, the PEN film with the transparent conductive film formed thereon was cut into a strip shape (short side: 30 mm×long side: 50 mm). Then, a PEN film with a pressure-sensitive adhesive (the thickness of the pressure-sensitive adhesive layer: 50 μm, the thickness of the PEN film (protective film): 50 μm) was bonded to a portion of the transparent conductive film such that a pair of end portions of the transparent conductive film facing each other and extending in the longitudinal direction were exposed. The pair of end portions each had a width of 2 mm. Further, the PEN film with pressure-sensitive adhesive was covered with a masking film, and a Cu thin film with a thickness of 100 nm was formed on the transparent conductive film and the masking film by DC magnetron sputtering. Still further, the Cu thin film was subjected to wet plating to increase the thickness of the Cu film to 3 μm. Thereafter, the masking film was removed, whereby a pair of power supply electrodes were formed at portions corresponding to the pair of end portions of the transparent conductive film. In the above-described manner, the heater member according to Example 13 was produced.

Comparative Example 1

A heater member according to Comparative Example 1 was produced in the same manner as in Example 1, except that a biaxially oriented PET film with a thickness of 125 μm was used instead of the PEN film.

Comparative Example 2

A heater member according to Comparative Example 2 was produced in the same manner as in Example 1, except that a polymethyl methacrylate (PMMA) film with a thickness of 125 μm was used instead of the PEN film.

Comparative Example 3

A heater member according to Comparative Example 3 was produced in the same manner as in Example 1, except that the conditions for the DC magnetron sputtering for forming an ITO film were changed such that a transparent conductive film had a thickness of 300 nm.

Comparative Example 4

A heater member according to Comparative Example 4 was produced in the same manner as in Example 1, except that the conditions for the DC magnetron sputtering for forming an ITO film were changed such that a transparent conductive film had a thickness of 15 nm.

COMPARATIVE EXAMPLE 5

A heater member according to Comparative Example 5 was produced in the same manner as in Example 8, except that a biaxially oriented PET film with a thickness of 125 μm was used instead of the PEN film.

Reference Example 1

A heater member according to Reference Example 1 was produced in the same manner as in Example 1, except that the conditions for the wet plating of a Cu thin film were changed such that power supply electrodes had a thickness of 0.3 μm.

Reference Example 2

A heater member according to Reference Example 2 was produced in the same manner as in Example 7, except that the conditions for the screen printing of a silver-containing paste were changed such that power supply electrodes had a thickness of 0.3 μm.

As shown in Table 1, in the energization test of the heater members according to Comparative Examples 1 to 3 and 5, cracking of the transparent conductive films was observed. The transparent conductive films of the heater members according to Comparative Examples 1, 2, and 5 had an internal stress (compressive stress) of more than 500 MPa, and also, the dimensional stabilities of the supports in the temperature range from 25° C. to 150° C. were not considered favorable. The transparent conductive film of the heater member according to Comparative Example 3 had a thickness of 300 nm. In contrast, in the energization test of the heater members according to Examples 1 to 13, cracking of the transparent conductive films was not observed. These results suggest that it is important that a transparent conductive film (heating elements) has an internal stress of 500 MPa or less, a support has favorable dimensional stability in a temperature range from 25° C. to 150° C., and the transparent conductive film has a thickness of more than 200 nm and not more than 20 nm, from the viewpoint of preventing the transparent conductive film from cracking when the heating element of a heater member exhibits a high temperature rise rate.

As shown in Table 1, in the energization test of the heater member according to Comparative Example 4, although the transparent conductive film did not crack, the temperature rise rate of the transparent conductive film was less than 20° C./min (8° C./min). The reason why such a low temperature rise rate was measured is considered to be that the transparent conductive film in the heater member according to Comparative Example 4 had a high sheet resistance. This suggests that, in the heater member according to Comparative Example 4, it is difficult for the transparent conductive film to heat up to a desired temperature within a short period of time. In contrast, in the energization test of the heater members according to Examples 1 to 13, the transparent conductive films exhibited a temperature rise rate of more than 20° C./min. In the energization test of the heater members according to Reference Examples 1 and 2, although separation between the power supply electrodes and the transparent conductive films did not occur and the transparent conductive films did not crack, the transparent conductive films both exhibited a temperature rise rate of 15° C./min. These results suggest that, in order to enable a transparent conductive film to heat up to a desired temperature within a short period of time, it is desirable that the sheet resistance of the transparent conductive film be set to 150 Ω/sq or less and that the thickness of the power supply electrodes is set to 1 μm or more.

TABLE 1

| | Transparent conductive film (heating element) | | | | | Support | | Power supply electrodes | | Protective | | | |
|---|---|---|---|---|---|---|---|---|---|---|---|---|---|
| | Crystal structure | Thickness [nm] | Sheet resistance [Ω/sq] | Specific resistance [×10⁻⁴ Ω·cm] | Internal stress (compressive stress) [MPa] | Material | Dimensional change rate [%] when heated from 25° C. to 150° C. | Material | Thickness [μm] | Film Material | Evaluation | | |
| | | | | | | | | | | | (1) | (2) | (3) |
| Ex. 1 | polycrystalline | 115 | 20 | 2.3 | 135 | PEN | 0.2 | Cu | 3 | — | 130 | N | N |
| Ex. 2 | polycrystalline | 115 | 20 | 2.3 | 63 | transparent PI | 0.1 | Cu | 3 | — | 130 | N | N |
| Ex. 3 | polycrystalline | 115 | 20 | 2.3 | 386 | PI | 0.4 | Cu | 3 | — | 130 | N | N |
| Ex. 4 | polycrystalline | 115 | 20 | 2.3 | 420 | PC | 0.6 | Cu | 3 | — | 130 | N | N |
| Ex. 5 | polycrystalline | 29 | 80 | 2.3 | 93 | PEN | 0.2 | Cu | 3 | — | 45 | N | N |
| Ex. 6 | polycrystalline | 153 | 15 | 2.3 | 155 | PEN | 0.2 | Cu | 3 | — | 155 | N | N |
| Ex. 7 | polycrystalline | 115 | 20 | 2.3 | 135 | PEN | 0.2 | Ag | 3 | — | 130 | N | N |
| Ex. 8 | polycrystalline | 50 | 46 | 2.3 | 135 | PEN | 0.2 | Cu | 3 | — | 95 | N | N |
| Ex. 9 | polycrystalline | 50 | 46 | 2.3 | 345 | PEN | 0.2 | Cu | 3 | — | 95 | N | N |
| Ex. 10 | polycrystalline | 50 | 46 | 2.3 | 135 | PEN | 0.2 | Cu | 20 | — | 95 | N | N |
| Ex. 11 | polycrystalline | 21 | 120 | 2.5 | 85 | PEN | 0.2 | Cu | 3 | — | 25 | N | N |
| Ex. 12 | polycrystalline | 168 | 13 | 2.2 | 211 | PEN | 0.2 | Cu | 3 | — | 155 | N | N |
| Ex. 13 | polycrystalline | 115 | 20 | 2.3 | 135 | PEN | 0.2 | Cu | 3 | PEN | 120 | N | N |
| Comp. Ex. 1 | polycrystalline | 115 | 20 | 2.3 | 783 | PET | 0.5 | Cu | 3 | — | 130 | Y | Y |
| Comp. Ex. 2 | polycrystalline | 115 | 20 | 2.3 | 652 | PMMA | −1.5 | Cu | 3 | — | 130 | Y | Y |
| Comp. Ex. 3 | polycrystalline | 300 | 8 | 2.3 | 482 | PEN | 0.2 | Cu | 3 | — | 210 | N | Y |
| Comp. Ex. 4 | polycrystalline | 15 | 153 | 2.3 | 70 | PEN | 0.2 | Cu | 3 | — | 8 | N | N |
| Comp. Ex. 5 | polycrystalline | 50 | 46 | 2.3 | 555 | PET | −0.5 | Cu | 3 | — | 95 | N | Y |
| Ref. Ex. 1 | polycrystalline | 115 | 20 | 2.3 | 135 | PEN | 0.2 | Cu | 0.3 | — | 15 | N | N |
| Ref. Ex. 2 | polycrystalline | 115 | 20 | 2.3 | 135 | PEN | 0.2 | Ag | 0.3 | — | 15 | N | N |

(1) Temperature rise rate when electrically energized [° C./min]
(2) Whether mini-at-ion between power supply electrodes and transparent conductive film occurred owing to energization
(3) Whether transparent conductive film cracked owing to energization

The invention claimed is:

1. A heater member comprising:
a support that is made of an organic polymer and has a sheet shape;
a heating element that is a transparent conductive film made of a polycrystalline material containing indium oxide as a main component, the heating element being in contact with one principal surface of the support; and
at least one pair of power supply electrodes in contact with one principal surface of the heating element, wherein
the heating element has a sheet resistance in a range from 10 to 150 Ω/sq,
the heating element has a thickness of more than 20 nm and not more than 200 nm,
the heating element exhibits a temperature rise rate of 30° C./min or more when a DC volage of 12 V is applied to the pair of power supply electrodes, and
an internal stress of the heating element as measured by an X-ray stress measurement method is 500 MPa or less.

2. The heater member according to claim 1, wherein, when a 4 mm wide test piece of the support is heated from 25° C. to 150° C. under application of a tensile force of 0.02 N in a specific direction orthogonal to a width direction of the test piece, a dimensional change rate of the test piece in the specific direction is −0.2% to 1%.

3. The heater member according to claim 1, wherein, when a 4 mm wide test piece of the heater member unprovided with the pair of electrodes is heated from 25° C. to 150° C. under application of a tensile force of 0.02 N in a specific direction orthogonal to a width direction of the test piece, a dimensional change rate of the test piece in the specific direction is −0.2% to 1%.

4. The heater member according to claim 1, wherein the support is made of at least one selected from the group consisting of polyethylene naphthalates, polyimides, polycarbonates, polyether ether ketones, and aromatic polyamides.

5. The heater element according to claim 1, wherein the heating element has a specific resistance of $1.5 \times 10^{-4}$ to $5.0 \times 10^{-4}$ Ω·cm.

6. The heater member according to claim 1, wherein the power supply electrodes have a thickness of 1 μm or more.

7. The heater member according to claim 1, further comprising:
- a protective film that is disposed closer to a second principal surface than to a first principal surface, the first principal surface being a principal surface of the heating element in contact with the support and the second principal surface being a principal surface of the heating element located on a side opposite to the first principal surface; and
- a first pressure-sensitive adhesive layer that is disposed between the protective film and the heating element in such a manner that the first pressure-sensitive adhesive layer is in contact with the protective film and the heating element.

8. A heater tape comprising:
the heater member according to claim 1;
a separator that is disposed closer to a fourth principal surface than to a third principal surface, the third principal surface being the principal surface of the support with which the heating element is in contact and the fourth principal surface being a principal surface of the support located on a side opposite to the third principal surface; and
a second pressure-sensitive adhesive layer that is disposed between the separator and the support in such a manner that the second pressure-sensitive adhesive layer is in contact with the separator and the support.

9. A heater member-equipped molded body comprising:
the heater member according to claim 1;
a molded body that is disposed closer to a fourth principal surface than to a third principal surface, the third principal surface being the principal surface of the support with which the heating element is in contact and the fourth principal surface being a principal surface of the support located on a side opposite to the third principal surface; and
a second pressure-sensitive adhesive layer that is disposed between the molded body and the support in such a manner that the second pressure-sensitive adhesive layer is in contact with the molded body and the support.

* * * * *